United States Patent
Thompson et al.

(10) Patent No.: US 10,374,164 B2
(45) Date of Patent: Aug. 6, 2019

(54) ORGANIC PHOTOSENSITIVE DEVICES COMPRISING A SQUARAINE CONTAINING ORGANOHETEROJUNCTION AND METHODS OF MAKING SAME

(71) Applicants: Mark E. Thompson, Anaheim, CA (US); Siyi Wang, Hillsboro, OR (US); Elizabeth Mayo, San Jose, CA (US); Maria Dolores Perez, Buenos Aires (AR)

(72) Inventors: Mark E. Thompson, Anaheim, CA (US); Siyi Wang, Hillsboro, OR (US); Elizabeth Mayo, San Jose, CA (US); Maria Dolores Perez, Buenos Aires (AR)

( * ) Notice: Subject to any disclaimer, the term of this patent is extended or adjusted under 35 U.S.C. 154(b) by 0 days.

(21) Appl. No.: 14/845,895

(22) Filed: Sep. 4, 2015

(65) Prior Publication Data
US 2015/0380658 A1    Dec. 31, 2015

Related U.S. Application Data

(63) Continuation of application No. 12/559,344, filed on Sep. 14, 2009, now abandoned.
(Continued)

(51) Int. Cl.
*H01L 51/00*    (2006.01)
*B82Y 10/00*    (2011.01)
(Continued)

(52) U.S. Cl.
CPC .......... *H01L 51/0059* (2013.01); *B82Y 10/00* (2013.01); *C09B 57/007* (2013.01);
(Continued)

(58) Field of Classification Search
None
See application file for complete search history.

(56) References Cited

U.S. PATENT DOCUMENTS 5,703,436 A    12/1997    Forrest et al.
6,097,147 A    8/2000    Baldo et al.
(Continued)

FOREIGN PATENT DOCUMENTS

EP    0172321    2/1986
EP    1970959    9/2008
(Continued)

OTHER PUBLICATIONS

Braccini, R.B. et al. New Class of Organic Photoconducting and Photovoltaic Materials. IBM Technical Disclosure Bulletin, IBM Corp., New York, US, vol. 19, No. 10, pp. 3932-3934, Mar. 1, 1977.
(Continued)

*Primary Examiner* — Clinton A Brooks
(74) *Attorney, Agent, or Firm* — Finnegan, Henderson, Farabow, Garrett & Dunner, LLP

(57) ABSTRACT

An organic photosensitive optoelectronic device comprising at least one Donor-Acceptor heterojunction formed from a squaraine compound of formula I:

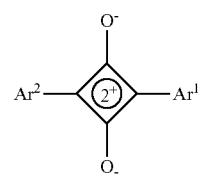

wherein each of $Ar^1$ and $Ar^2$ is independently chosen from an optionally substituted aromatic group. The organic opto-
(Continued)

electronic device described herein may also comprise a Donor-Acceptor heterojunction that is formed from at least two different squaraine compounds. A method of making the disclosed device, which may include at least one sublimation step for depositing the squaraine compound, is also disclosed.

19 Claims, 19 Drawing Sheets

Related U.S. Application Data

(60) Provisional application No. 61/097,143, filed on Sep. 15, 2008.

(51) Int. Cl.
    *C09B 57/00*     (2006.01)
    *H01L 51/42*     (2006.01)

(52) U.S. Cl.
    CPC ........ *H01L 51/4246* (2013.01); *H01L 51/001* (2013.01); *H01L 51/0003* (2013.01); *H01L 51/0046* (2013.01); *H01L 2251/308* (2013.01); *Y02E 10/549* (2013.01)

(56) References Cited

U.S. PATENT DOCUMENTS

| | | |
|---|---|---|
| 6,333,458 B1 | 12/2001 | Forrest et al. |
| 6,352,777 B1 | 3/2002 | Bulovic et al. |
| 6,420,031 B1 | 7/2002 | Parthasarathy et al. |
| 6,440,769 B2 | 8/2002 | Peumans et al. |
| 6,451,415 B1 | 9/2002 | Forrest |
| 6,580,027 B2 | 6/2003 | Forrest et al. |
| 6,657,378 B2 | 12/2003 | Forrest et al. |
| 6,972,431 B2 | 12/2005 | Forrest |
| 7,196,835 B2 | 3/2007 | Peumans et al. |
| 2005/0098204 A1 | 5/2005 | Roscheisen et al. |
| 2006/0032529 A1 | 2/2006 | Rand et al. |
| 2010/0085112 A1 | 3/2010 | Thompson et al. |
| 2012/0248419 A1 | 10/2012 | Thompson et al. |

FOREIGN PATENT DOCUMENTS

| | | |
|---|---|---|
| JP | 63-132246 | 8/1988 |
| JP | 1-146845 | 6/1989 |
| JP | 1-146846 | 6/1989 |
| JP | 07142751 A | 6/1995 |
| JP | 2003003082 | 1/2003 |
| JP | 2003-109676 | 4/2003 |
| JP | 2007 063364 A | 3/2007 |
| WO | WO-2006-041156 | 4/2006 |
| WO | WO-2007-049579 | 5/2007 |

OTHER PUBLICATIONS

Diego Bagnis et al: Marked Alkyl-vs Alkenyl-Substitutent Effects on Squaraine Dye Solid-State Structure, Carrier Mobility, and Bulk-Heterojunction Solar Cell Efficiency, Journal of the American Chemical Society, vol. 132, No. 12, (Mar. 2010) pp. 4074-4075.
Dr. H.-E. Sprenger and Dr. W. Ziegenbein; "Kondensationsprodukte aus Quadratsaeure und tertiaeren aromatischen Aminen," Angewandte Chemie., vol. 78, No. 20. (Oct. 1966), pp. 937-938.
Eberhard VV. Neuse et al: Dianilino derivatives of squaric acid, The Journal of Organic Chemistry. vol. 39, No. 26, (Dec. 1974), pp. 3881-3887.
English abstract of JP1-146845.
English abstract of JP1-146846.
English abstract of JP-2003-109676.
English abstract of JP-63-132246.
Fabio Silvestri et al: Efficient Squaraine-Based Solution Processable Bulk-Heterojunction Solar Cells, Journal of the American Chemical Society, vol. 130, No. 52, (Dec. 2008), pp. 17640-17641.
Guodan Wei et al: Efficient, Ordered Bulk Heterojunction Nanocrystalline Solar Cells by Annealing of Uitrathin Squaraine Thin Films, Nano Letters, vol. 10, No. 9, (Sep. 2010), pp. 3555-3559.
Guodan Wei et al: Solution-Processed Squaraine Bulk Heterojunction Photovoltaic Cells, ACS Nano, vol. 4. No. 4, (Apr. 2010), pp. 1927-1934.
Hwang, S.H. et al. Absorption Spectra and Electrophotographic Properties of Squarylium Dyes Containing a Nitro Group. Dyes and Pigments, 1998 Elsevier Science Ltd., vol. 39, No. 4, pp. 359-369.
International Search Report for PCT Application Serial No. PCT/US09/056954, dated Nov. 16, 2009.
International Search Report for PCT/US2012/024131 dated Aug. 28, 2012.
Jose V. Ros-Lis et al: Colorimetric Signaling of Large Aromatic Hydrocarbons via the Enhancement of Aggregation Processes, Organic Letters, vol. 7, No. 12, (Jun. 2005), pp. 2337-2339.
JP20033003082 Derwent Abstract, 2003, 4 pages.
Liu, F. et al. Enhancement of the Photoelectric Response of Squarine Dye by Using C60. Molecular Crystals and Liquid Crystals Science and Technology, 1999, vol. 337, pp. 361-364.
M. Forster et al.: Squarilium Dyes, Their Infrared and Resonance Raman Spectra and possible use in Redox Reactions for Solar-Energy Conversion. J. Chem. Soc. Faraday Trans, 1, vol. 78. (1982), pp. 1847-1886.
Miessler, G.L. et al. 1999. Chapter 1 Introduction to Inorganic Chemistry, 2nd Edition, Chapter 1, Introduction to Inorganic Chemistry, pp. 1-3; Upper Saddle River, NJ: Prentice-Hall, 1998.
Na Fu et al: Squaraine Rotaxanes with Boat Conformation Macrocycles, The Journal of Organic Chemistry, vol. 74, No. 17, (Sep. 2009). pp. 6462-6468.
Peumans, P. et al. American Institute of Physics, "Efficient photon harvesting at high optical intensities in ultrathin organic double-heterostructure photovoltaic diodes". Applied Physics Letters, vol. 76, No. 19, May 8, 2000, pp. 2650-2652.
Tang, C.W. Two-layer organic photovoltaic cell. Applied Physics Letters, 48(2), pp. 183-185, Jan. 13, 1986.
Tian et al. J. Phys. Chem. B, vol. 106, No. 17, 2002, 4370-4376.
Umut Oguz et al: One-Pot Synthesis of Squaraine Fluoroionophores, The Journal of Organic Chemistry, vol. 63, No. 17, (Aug. 1998), pp. 6059-6060.
V. Y. Merritt et al: Organic solar cells of hydroxy squarylium, Applied Physics Letters, vol. 29, No. 7, (Jan. 1976). pp. 414-415.
Written Opinion for PCT/US2012/024131 dated Aug. 28, 2012.
Yamanari, T. et al. Dye-Sensitized Bulk Heterojunction Polymer Solar Cells. Conference Record of the 2006 IEEE 4th World Conference on Photovoltaic Energy Conversion, pp. 240-243.
Zhao, W. et al. Study on Squarylium Cyanine Dyes for Photoelectric Conversion. Solar Energy Materials and Solar Cells, vol. 58, No. 2, pp. 173-183, Jun. 1, 1999.

Figure 5. AFM image of 100 Å SQ film

CuPc

US 10,374,164 B2

ORGANIC PHOTOSENSITIVE DEVICES COMPRISING A SQUARAINE CONTAINING ORGANOHETEROJUNCTION AND METHODS OF MAKING SAME

CROSS-REFERENCE TO RELATED APPLICATION

This application is a continuation of Application Ser. No. 12/559,344, filed Sep. 14, 2009, which claims priority benefit to U.S. Provisional Patent Application No. 61/097,143, entitled "Organic Photosensitive Devices Comprising a Squaraine Containing Organoheterojunction and Methods of Making Same," filed Sep. 15, 2008. The contents of these two applications are incorporated herein by reference.

JOINT RESEARCH AGREEMENT

The claimed invention was made by, on behalf of, and/or in connection with the following parties to a joint university-corporation research agreement: The University of Southern California, The Regents of the University of Michigan, and Global Photonic Energy Corporation. The agreement was in effect on and before the date the claimed invention was made, and the claimed invention was made as a result of activities undertaken within the scope of the agreement.

BACKGROUND

The present disclosure generally relates to organic photosensitive optoelectronic devices having a squaraine compound as a donor material. Methods of making such devices, which may include at least one sublimation step for depositing the squaraine compound, are also disclosed.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. Typically, a photovoltaic cell provides power to a circuit, device or equipment. A photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$f=\{I_{max} V_{max}\}/\{I_{SC} V_{OC}\} \qquad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = ff*(I_{SC}*V_{OC})/P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \psi S_0^*$. Here $S_0$ and $S_0^*$ denote ground and excited molecular states, respectively. This energy absorption is associated with the promotion of an electron from a bound state in the HOMO energy level, which may be a B-bond, to the LUMO energy level, which may be a B*-bond, or equivalently, the promotion of a hole from the LUMO energy level to the HOMO energy level. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair becomes separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In one embodiment, an acceptor material is an ETL and a donor material is a HTL.

Conventional inorganic semiconductor PV cells employ a p-n junction to establish an internal field. Early organic thin film cell, such as reported by Tang, *Appl. Phys Lett.* 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low external quantum efficiency (electromagnetic radiation to electricity conversion efficiency), being on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EXT for external quantum efficiency, A for photon absorption exciton generation, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D$~50Å) than the optical absorption length (~500Å), requiring a trade off between using a thick, and therefore resistive, cell with multiple or highly folded interfaces, or a thin cell with a low optical absorption efficiency.

Typically, when light is absorbed to form an exciton in an organic thin film, a singlet exciton is formed. By the mechanism of intersystem crossing, the singlet exciton may decay to a triplet exciton. In this process energy is lost which will result in a lower efficiency for the device. If not for the energy loss from intersystem crossing, it would be desirable to use materials that generate triplet excitons, as triplet excitons generally have a longer lifetime, and therefore a longer diffusion length, than do singlet excitons.

Through the use of an organometallic material in the photoactive region, the devices of the present invention may efficiently utilize triplet excitons. We have found that the singlet-triplet mixing may be so strong for organometallic compounds, that the absorptions involve excitation from the singlet ground states directly to the triplet excited states, eliminating the losses associated with conversion from the singlet excited state to the triplet excited state. The longer lifetime and diffusion length of triplet excitons in comparison to singlet excitons may allow for the use of a thicker photoactive region, as the triplet excitons may diffuse a greater distance to reach the donor-acceptor heterojunction, without sacrificing device efficiency.

SUMMARY OF THE INVENTION

Described herein is an organic photosensitive optoelectronic device comprising at least one organic heterojunction formed from a squaraine compound and methods of forming the same. In one embodiment, the organic photosensitive optoelectronic device comprises a squaraine compound of formula I:

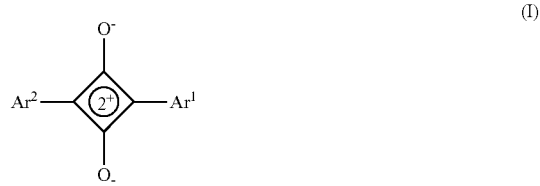

wherein each of $Ar^1$ and $Ar^2$ is an optionally substituted aromatic group. As used herein, the term "aromatic group" should be construed to mean, generally a cyclic moiety with conjugated double bonds providing a degree of electronic stabilization. Aromatic compounds are described in detail in Jones, M., Jr., *Organic Chemistry*, 1997 Norton: New York. The term "optionally substituted" should be construed to mean that each hydrogen atom in the moiety that is "optionally substituted" may be replaced with a different chemical group (e.g., an alkane, halide, hydroxy, alkoxy, amine, alkyl amino, dialkylamino, etc.) so long as the core structure depicted in the general formula remains intact.

In one embodiment, the squaraine compound of formula I is 2,4-Bis [4-(N,N-dipropylamino)-2,6-dihydroxyphenyl or a salt thereof.

In one embodiment, the organic photosensitive optoelectronic is a solar cell or photodetector. In another embodiment, the solar cell or photodetector comprises an organic heterojunction. In another embodiment the organic heterojunction is a donor-acceptor heterojunction, formed at an interface of a donor material comprising the squaraine compound of formula I and an acceptor material.

The organic photosensitive optoelectronic device may optionally comprise $C_{60}$. For example, the $C_{60}$ may be positioned such that it is in contact with the squaraine compound. As used herein, "$C_{60}$" is intended to represent the molecule Buckminsterfullerene, which may be described by the IUPAC name ($C_{60}$-$I_h$)fullerene).

In one embodiment, the optionally substituted aromatic groups ($Ar^1$ and $Ar^2$) of the squaraine compounds described by the above formula I are each independently chosen from a group of the following formula II:

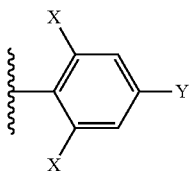

(II)

wherein each X is independently chosen from H, alkyl, alkoxy, halide, and hydroxy; and Y is chosen from H or an optionally substituted amino group. In another embodiment, each X group of the above formula II is hydroxy. As used herein, "independently chosen from" means that each "X" may be varied independently of the other. Of course, they may also be the same. In another embodiment, each Y group in the above formula II is independently chosen from a group represented by the formula $NR^1R^2$, wherein each of $R^1$ and $R^2$ is independently H or an optionally substituted alkyl or aryl group. In another embodiment, at least one of $R^1$ and $R^2$ in the above-mentioned formula $NR^1NR^2$ is an optionally substituted alkyl group.

As used herein, amino groups are intended to include any salts, such as acid addition salts, thereof. For example, any reference to an amine also contemplates the ammonium salt and any reference to or embodiment of the group $NR^1R^2$ should be construed to include analogous salts such as acid addition salts, etc.

In one embodiment, the organic photosensitive optoelectronic device comprises a squaraine compound of the formula III:

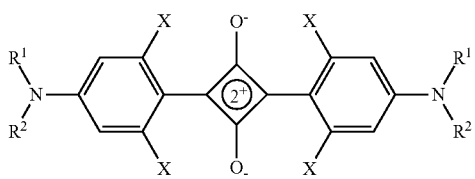

(III)

wherein each X is independently chosen from H, alkyl, alkoxy, halide, and hydroxy; and each of $R^1$ and $R^2$ is independently an optionally substituted alkyl or aryl group. In another embodiment, at least one X group of the compound of the above formula III is hydroxy. As previously stated, "independently chosen from" means that each "X" may be varied independently of the other. Of course, they may also be the same.

In one embodiment, the organic photosensitive optoelectronic device comprises a squaraine compound of the above formula I, wherein each of $A^1$ and $Ar^2$ is independently chosen from a group represented by the following formula V:

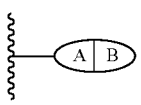

(V)

wherein each of rings A and B are optionally substituted $C_4$-$C_8$ rings, which are fused to form a bicyclic saturated or unsaturated ring system of 6-14 carbon atoms. For example, in one illustrative case, two benzene rings (each $C_6$) may be fused to form a naphthlene molecule ($C_{10}$) of formula V.

In one embodiment of the invention, the squaraine compound of formula I is chosen from 2,4-Bis [4-(N,N-dipropylamino)-2,6-dihydroxyphenyl; 2,4-Di-3-guaiazulenyl-1,3-dihydroxycyclobutenediylium dihydroxide; 2,4-Bis[4-(N,N-diisobutylamino)-2,6-dihydroxyphenyl, and salts thereof.

In one embodiment, one or both of the groups $A^1$ and $Ar^2$ in the compound of formula I is independently a group represented by formula VI:

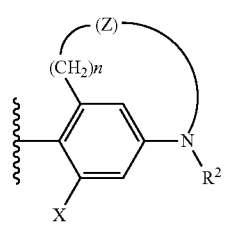

(VI)

wherein n is chosen from 0, 1, 2, 3, 4, 5, and 6; and Z represents a linking group. As used herein the term "linking group" is intended to mean a chemical group that connects the nitrogen atom of the amino group at the 4-position to the position meta to it on the group represented by the formula VI. For example, a linking group may be an alkyl group, an alkenyl group, an amino group, an aromatic group, an ether group, etc.

It is appreciated that the squaraine compound of formula I may or may not be symmetric. As used herein, the term "symmetric" is intended to include compounds with a point group symmetry of an order higher than the $C_s$ symmetry group.

In one embodiment is provided a method of forming an organic photosensitive optoelectronic device, the method comprising forming an organic heterojunction by depositing on a substrate, a squaraine compound of formula I:

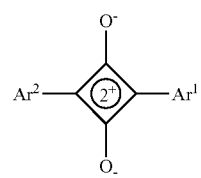

(I)

wherein each of $A^1$ and $Ar^2$ is an optionally substituted aromatic group. In another embodiment, the substrate comprises at least one electrode or charge transfer layer comprising any sufficiently transparent collecting electrode. Non-limiting examples of such transparent collecting electrodes include transparent conducting oxides, such as indium tin oxide (ITO), gallium indium tin oxide (GITO), and zinc indium tin oxide (ZITO).

In one embodiment, the squaraine compound is deposited by sublimation. As used herein, sublimation may include but is not limited to vacuum deposition. Accordingly, sublimation may be carried out at any temperature and pressure suitable for depositing the materials.

In addition to depositing the squaraine compounds by sublimation, subliming the squaraine compounds may afford certain benefits regarding purification. It has been discovered that one or more times sublimed squaraines give amorphous films and better properties than non-sublimed films. While not being bound by any theory, it is believed that multiple sublimation steps act as purification steps, for example, to remove trapping impurities otherwise present whether the resulting film is amorphous or crystalline.

In one embodiment, the squaraine compound of formula I is deposited at a rate ranging from 0.1 to 1.5 Å/sec, such as 0.2 to 1.0 Å/sec, or even 0.2 to 0.6 Å/sec.

In one embodiment, the deposited squaraine compound of formula I has a thickness of 100 Å or less, such as 65 Å or less, even 50 Å or less. As used herein the "thickness" refers to the thickness of the layer (e.g., the thickness of the layer of the squaraine compound) as opposed to the molecular characteristics (e.g., bond distances) of materials that form any given layer.

It is to be appreciated that this material can be a good donor in any device architecture. Non-limiting mention is made to the squaraine material being used in an architectural arrangement chosen from planar, bulk heterojunctions, hybrid-planar mixed, nanocrystalline bulk heterojunctions, and the like. Mention is made to using this material as a good donor toward $C_{60}$ in any device architecture.

In another embodiment, the squaraine described herein may also be a good donor for other acceptors. In addition, if the energies are chosen correctly and it transports electrons, the disclosed squaraines could even be an acceptor for a given donor, again in a range of device architectures, such as those previously mentioned.

It is to be appreciated that the Donor-Acceptor heterojunction according to the present disclosure may comprise at least two different squaraine compounds described herein, such as mixture of two different squaraines. Thus, there is also described methods of making such a device comprising a mixture of two or more different squaraines.

In one embodiment, the deposited squaraine compound forms a discontinuous layer. As used herein, the term "discontinuous layer" is intended to mean a layer (e.g., a layer of a squaraine compound) that does not have a uniform thickness throughout the layer. In one embodiment, the discontinuous layer of the invention is a layer that does not completely cover all portions of the layer (or substrate) onto which it was deposited, thereby resulting in some portions of that layer being exposed after depositing the discontinuous layer.

In another embodiment, the deposited squaraine compound forms isolated nanoscale domains. As used herein "isolated nanoscale domains" is used to contrast uniform thin film, and thus refers to a portion of the deposited squaraine compound that exists as 1-50 nm domains, forming a discontinuous thin film.

In one embodiment, $C_{60}$ is deposited such that it is in contact with the squaraine compound in the organic photosensitive optoelectronic device. In another embodiment the squaraine layer is ultrathin, such that the $C_{60}$ has direct contact with the substrate.

In one embodiment, the $C_{60}$ compound is deposited by vacuum deposition, vapor deposition, or sublimation.

In another embodiment, the $C_{60}$ layer is deposited by solution process deposition.

In one embodiment, the $C_{60}$ is deposited at a rate of from about 2 to about 6 Å/s, such as 4 Å/s.

In one embodiment the method of forming an organic photosensitive optoelectronic device comprises depositing CuPc on the substrate prior to depositing the squaraine compound. In another embodiment, the method of forming an organic photosensitive optoelectronic device comprises depositing a layer of an organic compound (e.g., NPD) on the substrate prior to depositing the squaraine compound in order to enhance performance. Without being bound by any theory, it is believed that this organic compound acts to form a better contact between the squaraine and the ITO anode.

DETAILED DESCRIPTION

The present disclosure is directed to an organic photosensitive optoelectronic devices. Organic devices of embodiments of the present invention may be used, for example, to generate a usable electrical current from incident electromagnetic radiation (e.g., PV devices) or may be used to detect incident electromagnetic radiation. Embodiments of the present invention may comprise an anode, a cathode, and a photoactive region between the anode and the cathode. The photoactive region is the portion of the photosensitive device that absorbs electromagnetic radiation to generate excitons that may dissociate in order to generate an electrical current. Organic photosensitive optoelectronic devices may also include at least one transparent electrode to allow incident radiation to be absorbed by the device. Several PV device materials and configurations are described in U.S. Pat. Nos. 6,657,378, 6,580,027, and 6,352,777, which are incorporated herein by reference in their entirety.

Figure 1:
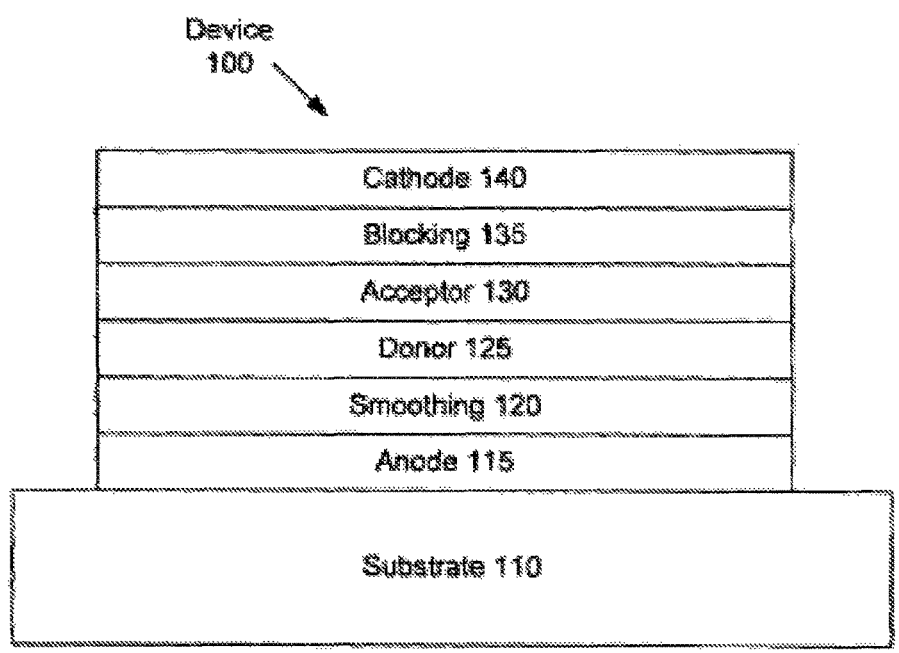
FIG. 1 illustrates an organic PV device comprising an anode, an anode smoothing layer, a donor layer, an acceptor layer, a blocking layer, and a cathode.
Figure 2:
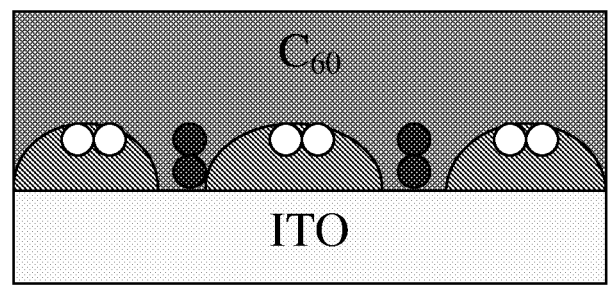
FIG. 2 illustrates the proposed model of charge carrier separation in an exemplary SQ device, bounded excitons (white) in SQ phase and bounded excitons (black) in $C_{60}$ Phase.
Figure 3:
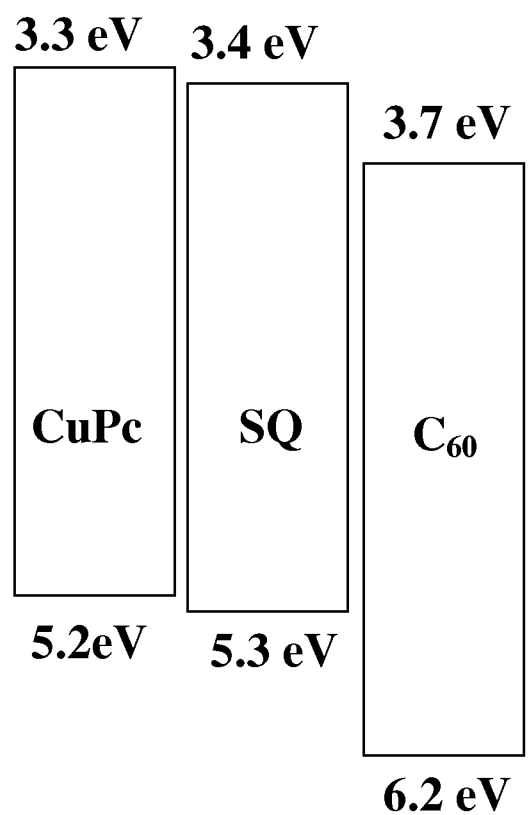
FIG. 3 is a schematic energy level diagram for devices with (a) CuPc or (b) SQ as the donor layer. The HOMO energies are from UPS. The LUMO energies are from Inverse photoemission spectroscopy (IPES) measurements, except for SQ where the LUMO and HOMO energies are determined by electrochemistry.
Figure 4:
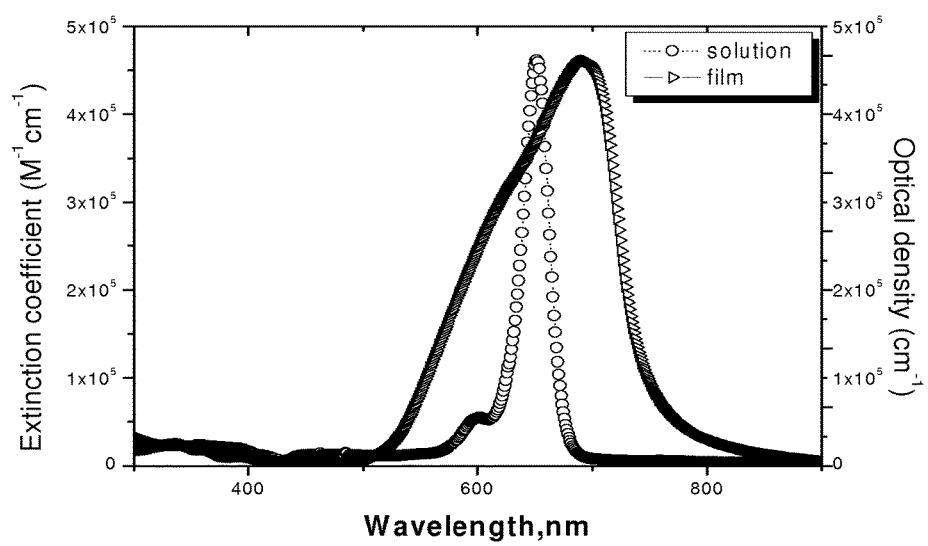
FIG. 4 is a graph, showing the extinction coefficient of SQ film on quartz and SQ in solution dichloromethane, as a function of wavelength.
Figure 5:
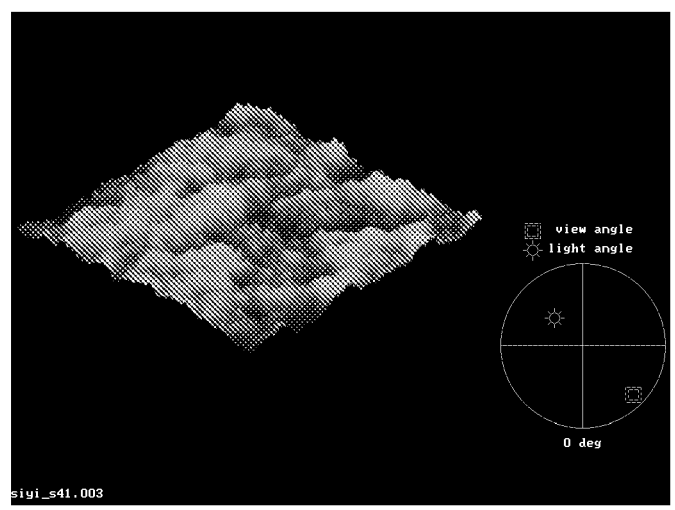
FIG. 5 is a Atomic Force Microscope (AFM) image of a 100 Å squaraine film.
Figure 6:
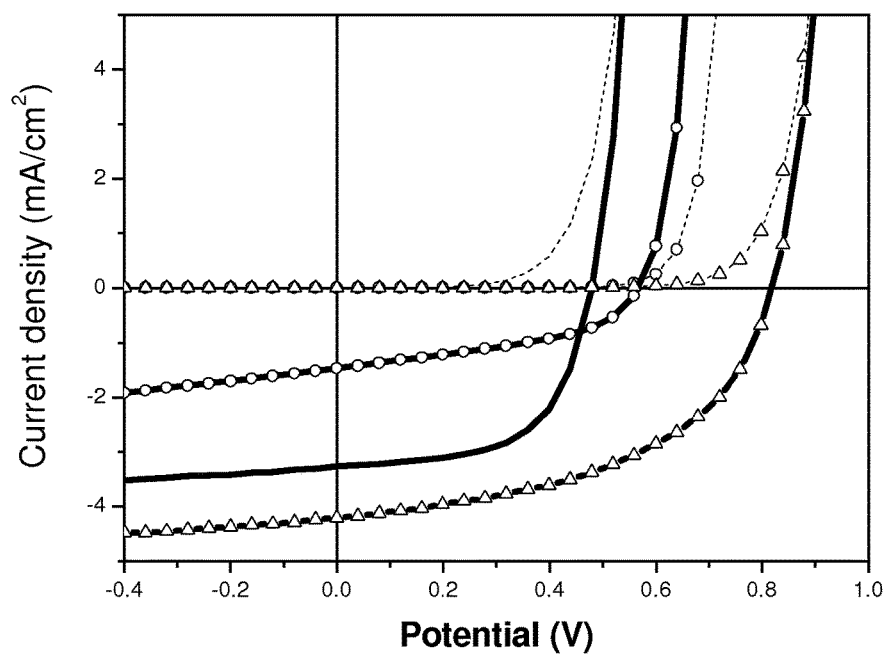
FIG. 6 is a graph, J-V characteristics of ITO/CuPc (400 Å)/$C_{60}$ (400 Å)/BCP (100 Å)/Al (1000 Å) (black), ITO/SQ (74 Å)/$C_{60}$ (400 Å)/BCP (100 Å)/Al (1000 Å) (triangle) and ITO/C60(400 Å)/BCP(100 Å)/Al(1000 Å) (circle) under 1 sun AM 1.5G simulated illumination (solid) and in the dark (dashed).
Figure 7:
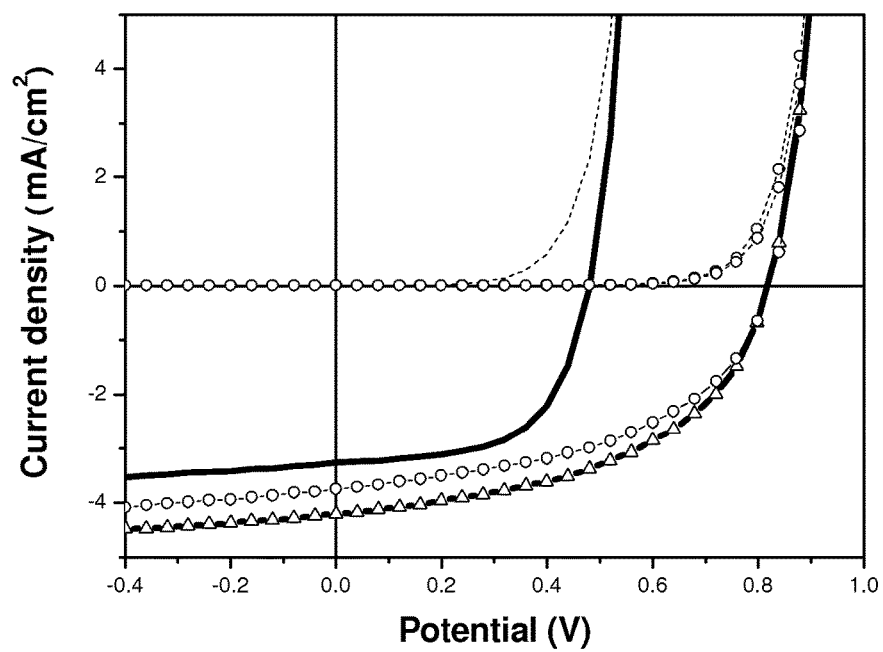
FIG. 7 is a graph, showing the J-V characteristics of an ITO/CuPc (400 Å)/$C_{60}$ (400 Å)/BCP (100 Å)/Al (1000 Å) (black), ITO/SQ(74 Å)/$C_{60}$ (400 Å)/BCP (100 Å)/Al (1000 Å) (triangle) device and ITO/SQ(74 Å)/$C_{60}$ (400 Å)/BCP (100 Å)/Al (1000 Å)(circle) tested one hour later under AM1.5G simulated solar illumination (solid) and in the dark (dashed) at 1 sun.
Figure 8:
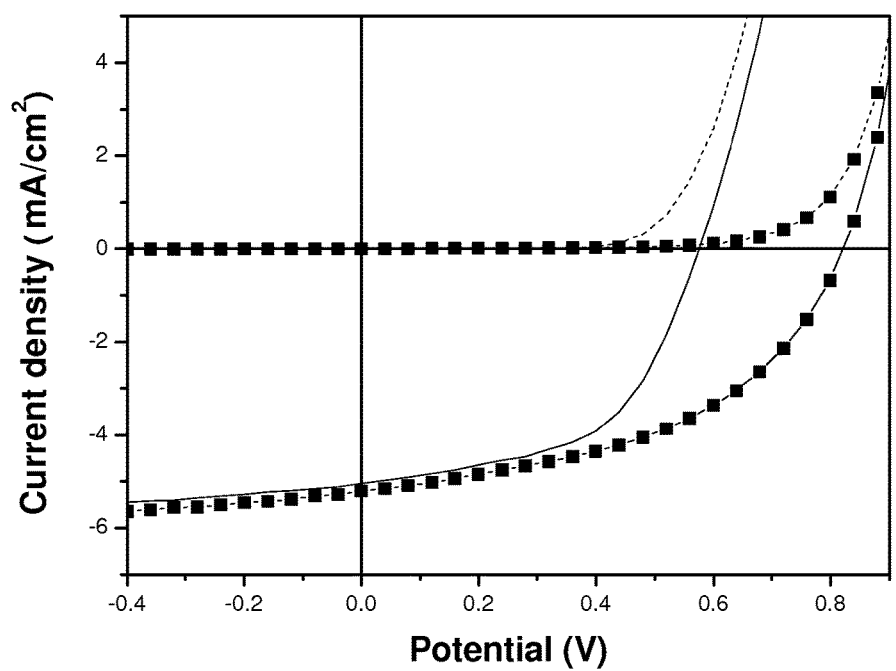
FIG. 8 is a graph showing J-V characteristics of an ITO/SQ(74 Å)/$C_{60}$ (400 Å)/BCP (100 Å)/Al (1000 Å) [SQ rate<1 Å/s, dark], ITO/SQ(74 Å)/$C_{60}$ (400 Å)/BCP (100 Å)/Al (1000 Å) [SQ rate~3 Å/s, square] under AM1.5G simulated solar illumination (solid) and in the dark (dashed) at 1 sun.
Figure 9:
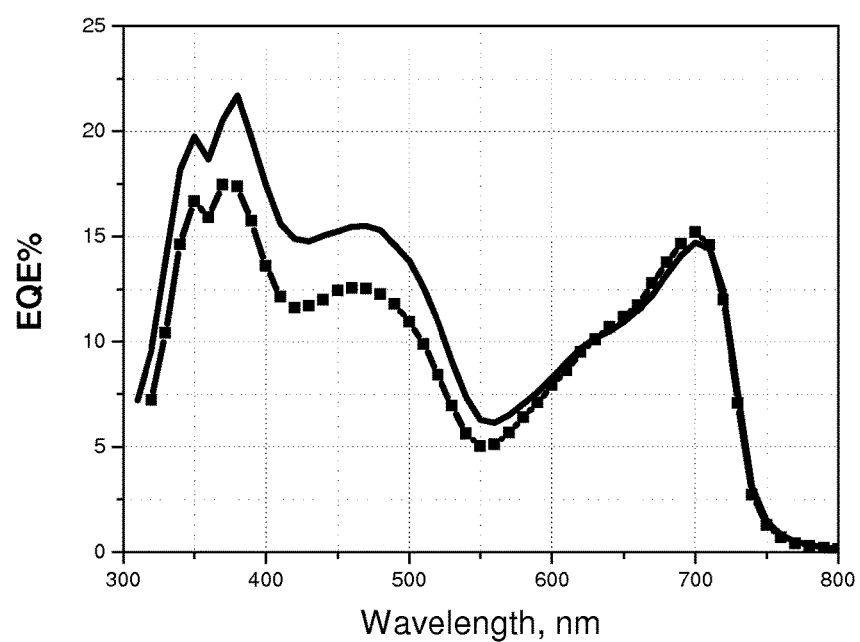
FIG. 9 is a graph comparing the external quantum efficiency curves of two SQ devices, each with a different $C_{60}$ deposition rate: a) $C_{60}$ deposition rate 4 Å/s (black); b) $C_{60}$ deposition rate 2 Å/s (square).
Figure 10:
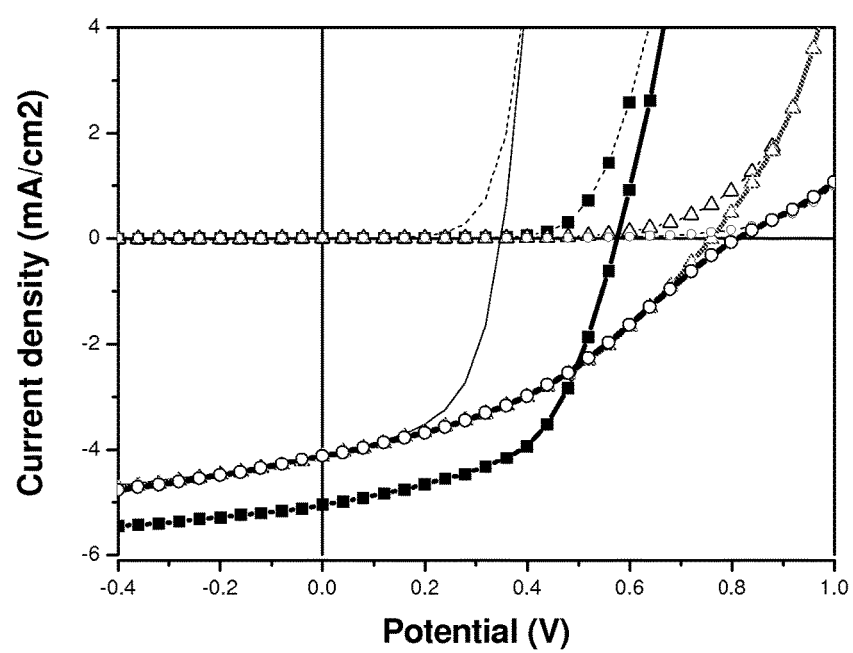
FIG. 10 is a graph showing the J-V characteristics curve of SQ devices with various SQ thicknesses (indicated by the variable x) with architecture ITO/SQ(x Å)/C60 (400 Å)/BCP(100 Å)/Al under AM1.5G simulated solar illumination at 1 sun (solid) and in the dark (dashed): 1) x=50 (black); 2) x=65 (square); 3) x=75 (triangle) and 4) x=100 (circle).
Figure 11:
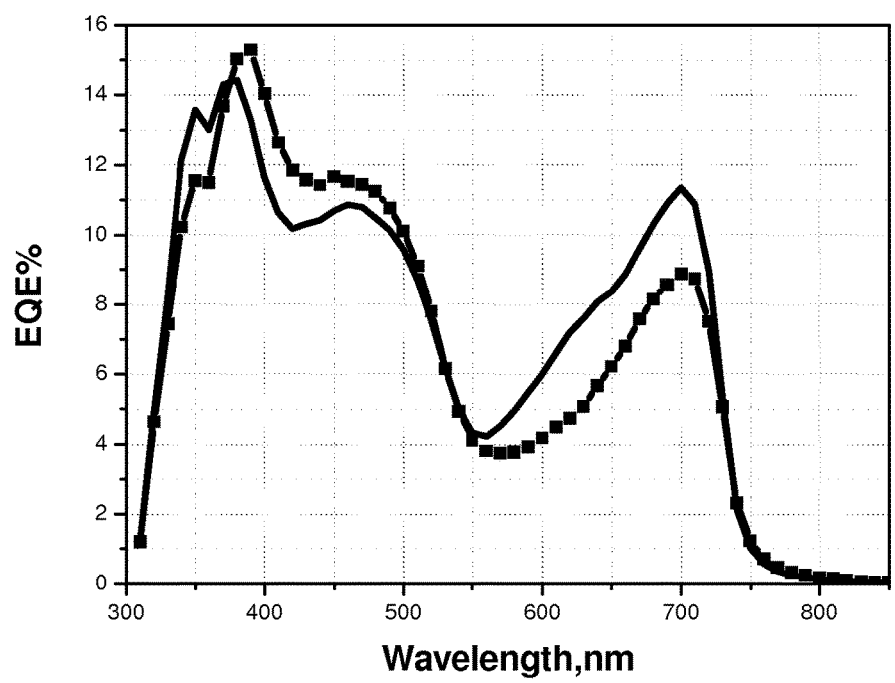
FIG. 11 shows a graph of the external quantum efficiency curve of SQ devices with the following architectures: ITO/SQ(65 Å)/C60 (400 Å)/BCP(100 Å)/Al (1000 Å); and ITO/SQ(65 Å)/CuPC60 (400 Å)/BCP (100 Å)/Al (1000 Å).
Figure 12:
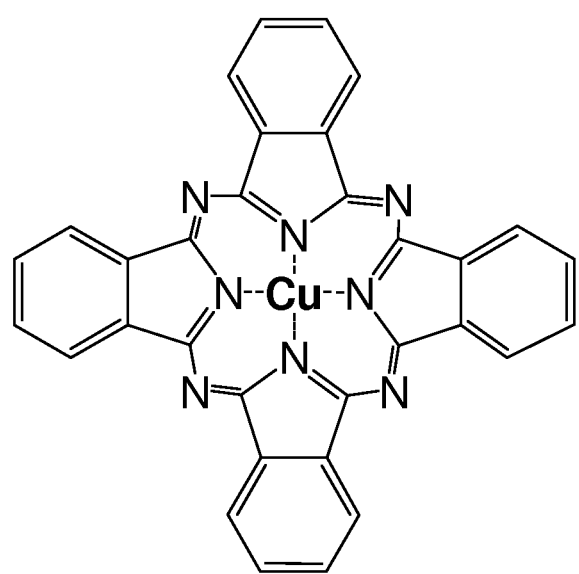
FIG. 12 depicts the chemical structure of copper phthalocyanine (CuPc).
Figure 13:
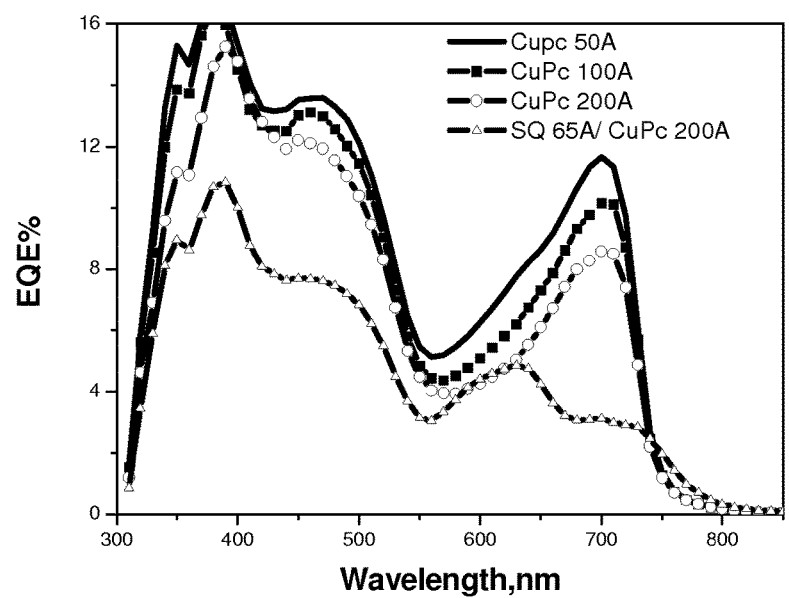
FIG. 13 is a graph of the external quantum efficiency curves of ITO/CuPc(x Å)/SQ (65 Å)/C60 (400 Å)/BCP (100 Å)/Al (1000 Å): a)x=50 (black); b) x=100 (square); c) x=200 (circle). ITO/SQ (65 Å)/CuPc(200 Å)/C60 (400 Å)/BCP (100 Å)/Al (1000 Å) (triangle).
Figure 14:
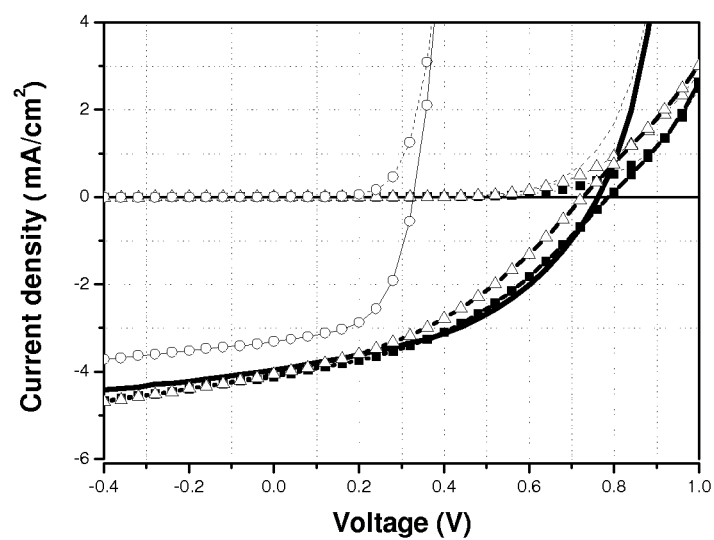
FIG. 14 is a graph of the J-V characteristics curve of SQ devices with architecture ITO/CuPc(50 Å)/SQ(x Å)/C60 (400 Å)/BCP(100 Å)/Al: 1) x=65 (black); 2) x=130 (square); 3) x=180 (triangle) and 4) x=0 (circle) under AM1.5G simulated solar illumination (solid) and in the dark (dashed) at 1 sun.
Figure 15:
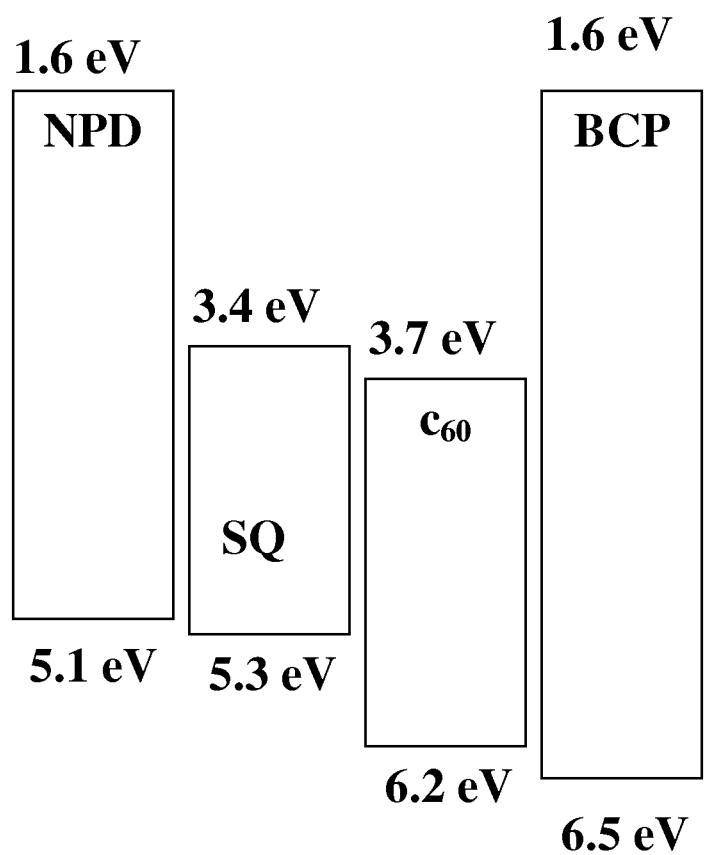
FIG. 15 is a schematic energy level diagram for NPD, SQ, $C_{60}$ and BCP. HOMO energies are from UPS, and the LUMO energies are from IPES measurements, except for SQ and NPD where the LUMO and HOMO energies are determined from electrochemistry.

FIG. 1 shows an organic photosensitive optoelectronic device 100. The figures are not necessarily drawn to scale. Device 100 may include a substrate 110, an anode 115, an anode smoothing layer 120, a donor layer 125, an acceptor layer 130, a blocking layer 135, and a cathode 140. Cathode 140 may be a compound cathode having a first conductive layer and a second conductive layer. Device 100 may be fabricated by depositing the layers described, in order. Charge separation may occur predominantly at the organic heterojunction between donor layer 125 and acceptor layer 130. The built-in potential at the heterojunction is determined by the HOMO-LUMO energy level difference between the two materials contacting to form the heterojunction. The HOMO-LUMO gap offset between the donor and acceptor materials produce an electric field at the donor/acceptor interface that facilitates charge separation for excitons created within an exciton diffusion length of the interface.

The specific arrangement of layers illustrated in FIG. 1 is exemplary only, and is not intended to be limiting. For example, some of the layers (such as blocking layers) may be omitted. Other layers (such as reflective layers or additional acceptor and donor layers) may be added. The order of layers may be altered. Arrangements other than those specifically described may be used.

The substrate may be any suitable substrate that provides desired structural properties. The substrate may be flexible or rigid, planar or non-planar. The substrate may be transparent, translucent or opaque. Plastic and glass are examples of rigid substrate materials that may be used herein. Plastic and metal foils are examples of flexible substrate materials that may be used according to the present disclosure. The material and thickness of the substrate may be chosen to obtain desired structural and optical properties.

U.S. Pat. No. 6,352,777, incorporated herein by reference, provides examples of electrodes, or contacts, that may be used in a photosensitive optoelectronic device. When used herein, the terms "electrode" and "contact" refer to layers that provide a medium for delivering photo-generated current to an external circuit or providing a bias voltage to the device. That is, an electrode, or contact, provides the interface between the active regions of an organic photosensitive optoelectronic device and a wire, lead, trace or other means for transporting the charge carriers to or from the external circuit.

In a photosensitive optoelectronic device, it is desirable to allow the maximum amount of ambient electromagnetic radiation from the device exterior to be admitted to the photoconductively active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. That is, such a contact should be substantially transparent. The opposing electrode may be a reflective material so that light which has passed through the cell without being absorbed is reflected back through the cell.

As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some, but less that 50% transmission of ambient electromagnetic radiation in relevant wavelengths are said to be "semi-transparent."

As used herein, "top" means farthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

In one embodiment, the electrodes are composed of metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO).

ITO is a highly doped degenerate n+ semiconductor with an optical bandgap of approximately 3.2 eV, rendering it transparent to wavelengths greater than approximately 390 nm. Another suitable metal substitute is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form.

Free metals typically have a form of metallic bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

Embodiments of the present invention may include, as one or more of the transparent electrodes of the photosensitive optoelectronic device, a highly transparent, non-metallic, low resistance cathode such as disclosed in U.S. Pat. No. 6,420,031, to Parthasarathy et al. ("Parthasarathy '031"), or a highly efficient, low resistance metallic/non-metallic compound cathode such as disclosed in U.S. Pat. No. 5,703,436 to Forrest et al. ("Forrest '436"), both incorporated herein by reference in their entirety. Each type of cathode may be prepared in a fabrication process that includes sputter depositing an ITO layer onto either an organic material, such as copper phthalocyanine (CuPc), to form a highly transparent, non-metallic, low resistance cathode or onto a thin Mg:Ag layer to form a highly efficient, low resistance metallic/non-metallic compound cathode. Parthasarathy '031 discloses that an ITO layer onto which an organic layer had been deposited, instead of an organic layer onto which the ITO layer had been deposited, does not function as an efficient cathode. For PVs the ITO would be deposited onto the substrate, unless the layers were being deposited in the reverse orientation.

In addition to CuPc, an organic compound that facilitates the formation of crystalline or amorphous films (such as, e.g., NPD) may be utilized as a hole transporting material between the anode (e.g., ITO) and the SQ. The organic film-facilitating compound does not contribute to photon absorption and has suitable energetics with SQ. When used in concert with $C_{60}$, the presence of a layer of an organic film-facilitating compound may ensure that the $C_{60}$ is not be in contact with the ITO, thus preventing loss of $C_{60}$ inherent photocurrent. Additionally, an organic film-facilitating compound does not trap charge according to its well known good hole mobility. In one embodiment of the invention the following device structure is fabricated: ITO/NPD (x Å)/SQ (65 Å)/C60 (400 Å)/BCP (100 Å)/Al (1000 Å). The thickness of the NPD layer may be varied in order to optimize the SQ device performance. For example, the NPD layer may be less than 200 Å, less than 100 Å, or less than 75 Å. In one embodiment the NPD layer is 50 Å.

Figure 16:
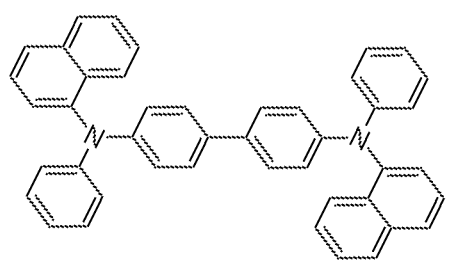
FIG. 16 depicts the chemical structure N,N'-di-1-naphthyl-N,N'-diphenyl-1,1'-biphenyl-4,4'diamine (NPD) in its free base form.
Figure 17:
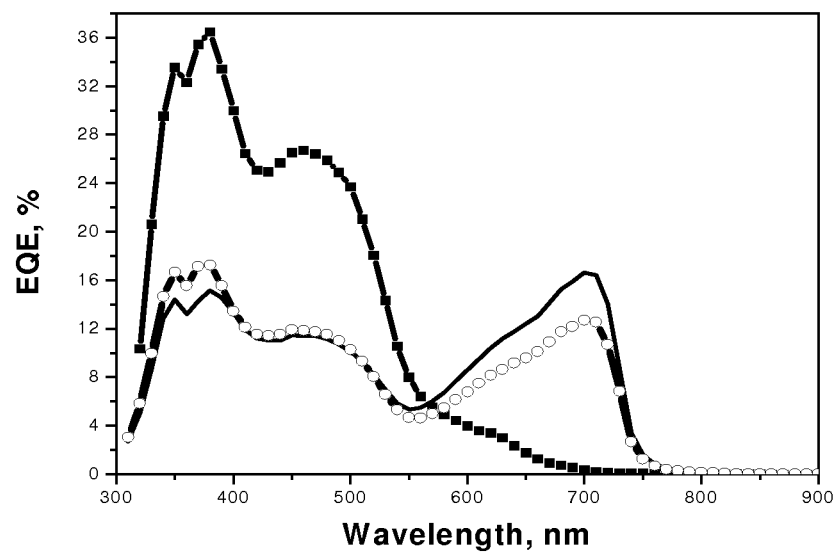
FIG. 17 is a graph of the external quantum efficiency curves of (a) ITO/NPD(50 Å)/SQ (65 Å)/C60 (400 Å)/BCP (100 Å)/Al (1000 Å) (black); (b) ITO/NPD(50 Å)/C60 (400 Å)/BCP (100 Å)/Al (1000 Å) (square); (c) ITO/CuPc(50 Å)SQ (65 Å)//C60 (400 Å)/BCP (100 Å)/Al (1000 Å) (circle).
Figure 18:
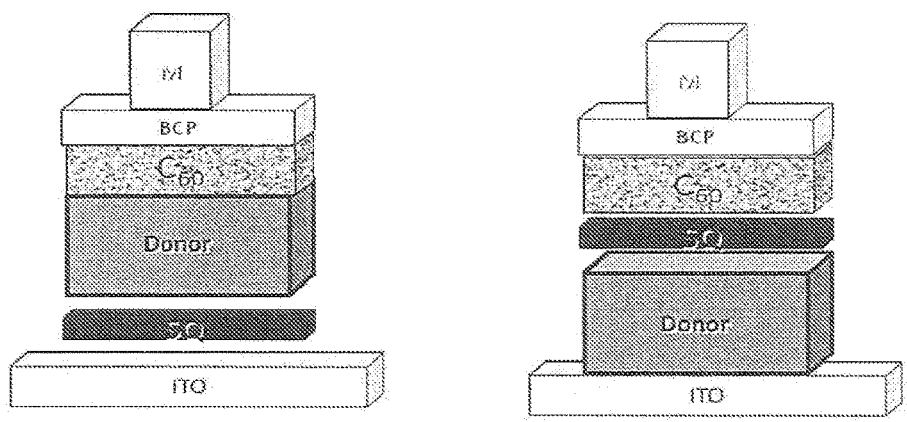
FIG. 18 is a schematic of possible architectures of SQ containing device made according to the present disclosure.
Figure 19:
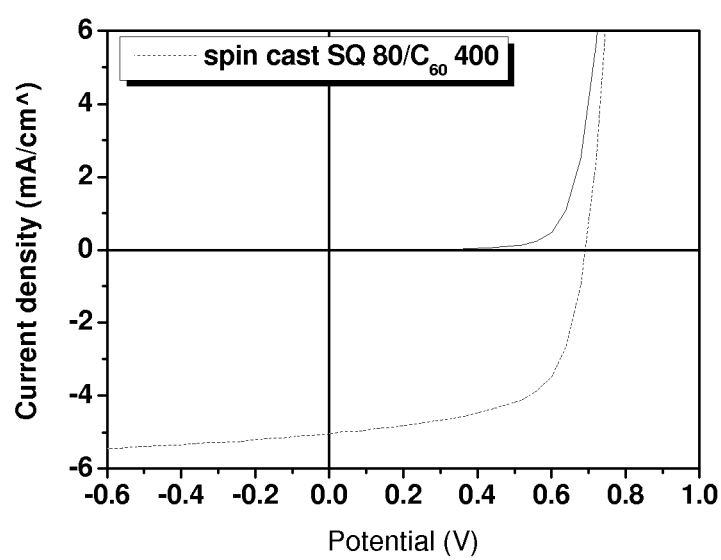
FIG. 19 is a graph showing current density as a function of potential for a spin cast SQ device made according to the present disclosure.

The chemical structure of NPD is depicted in FIG. 16. Within the context of this application, NPD is not limited to only the free base form and therefore may include, for example, any salts of NPD including mono and/or di-acid addition products.

Herein, the term "cathode" is used in the following manner. In a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photo-conducting material, which is equivalent to electrons moving in the opposite manner. It will be noted that as the terms are used herein, anodes and cathodes may be electrodes or charge transfer layers.

An organic photosensitive device will comprise at least one photoactive region in which light is absorbed to form an excited state, or "exciton", which may subsequently dissociate into an electron and a hole. The dissociation of the exciton will typically occur at the heterojunction formed by the juxtaposition of an acceptor layer and a donor layer. For example, in the device of FIG. 1, the "photoactive region" may include donor layer 125 and acceptor layer 130.

The acceptor material may be comprised of, for example, perylenes, naphthalenes, fullerenes or nanotubules. An example of an acceptor material is 3,4,9,10-perylenetetracarboxylic bis-benzimidazole (PTCBI). Alternatively, the acceptor layer may be comprised of a fullerene material as described in U.S. Pat. No. 6,580,027, incorporated herein by reference in its entirety. Adjacent to the acceptor layer, is a layer of organic donor-type material. The boundary of the acceptor layer and the donor layer forms the heterojunction which may produce an internally generated electric field. The material of the donor layer may be a pthalocyanine or a porphyrin, or a derivative or transition metal complex thereof, such as copper pthalocyanine (CuPc). Other suitable acceptor and donor materials may be used. As described herein, one donor material of particular importance to the present invention is squaraine compounds of the following formula I:

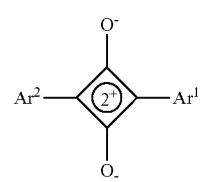

(I)

wherein each of $Ar^1$ and $Ar^2$ is an optionally substituted aromatic group. Such compounds may be used alone or in addition to other donor materials. All references to compounds of formula I, including, for example, the devices and methods comprising compounds of formula I are intended to encompass any salts or derivatives of these compounds. For example, one of skill in the art will recognize that a compound of formula I may be present in a ketone or alcohol form rather then the charge separated form depicted.

In one embodiment of the invention, the stacked organic layers include one or more exciton blocking layers (EBLs) as described in U.S. Pat. No. 6,097,147, Peu mans et al, *Applied Physics Letters* 2000, 76, 2650-52, and co-pending application Ser. No. 09/449,801, filed Nov. 26, 1999, both incorporated herein by reference. Higher internal and external quantum efficiencies have been achieved by the inclusion of an EBL to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials. EBLs can also function as optical spacers that allow for the focusing of optical field peaks in the active area of the cell.

It is believed that the EBLs derive their exciton blocking property from having a LUMO-HOMO energy gap substantially larger than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL may block one sign of charge carrier. By design, an EBL will exist between two other layers, usually an organic photosensitive semiconductor layer and an electrode or charge transfer layer or charge recombination layers. The adjacent electrode or charge transfer layer will be in context either a cathode or an anode. Therefore, the material for an EBL in a given position in a device will be chosen so that the desired sign of carrier will not be impeded in its transport to or from the electrode or charge transfer layer. Proper energy level alignment ensures that no barrier to charge transport exists, preventing an increase in series resistance. For example, it is desirable for a material used as a cathode side EBL to have a LUMO energy level closely matching the LUMO energy level of the adjacent ETL material so that any undesired barrier to electrons is minimized.

It should be appreciated that the exciton blocking nature of a material is not an intrinsic property of its HOMO-LUMO energy gap. Whether a given material will act as an exciton blocker depends upon the relative HOMO and LUMO energy levels of the adjacent organic photosensitive material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an organic PV device.

In one embodiment of the invention, an EBL is situated between the acceptor layer and the cathode. One material for the EBL comprises 2,9-dimethyl-4,7-diphenyl-1,10-phenanthroline (also called bathocuproine or BCP), which is believed to have a LUMO-HOMO energy level separation of about 3.5 eV, or bis(2-methyl-8-hydroxyquinolinoato)-aluminum(III)phenolate ($Alq_2OPH$). BCP is an effective exciton blocker which can easily transport electrons to the cathode from an acceptor layer.

The EBL layer may be doped with a suitable dopant, including but not limited to 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), and derivatives thereof. It is thought that the BCP as deposited in the present devices is amorphous. The present apparently amorphous BCP exciton blocking layers may exhibit film recrystallization, which is especially rapid under high light intensities. The resulting morphology change to polycrystalline material results in a lower quality film with possible defects such as shorts, voids or intrusion of electrode material.

Accordingly, it has been found that doping of some EBL materials, such as BCP, that exhibit this effect with a suitable, relatively large and stable molecule can stabilize the EBL structure to prevent performance degrading morphology changes. It should be further appreciated that doping of an EBL which is transporting electrons in a given device with a material having a LUMO energy level close to that of the EBL will help insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

Representative embodiments may also comprise transparent charge transfer layers or charge recombination layers.

As described herein charge transfer layers are distinguished from acceptor and donor layers by the fact that charge transfer layers are frequently, but not necessarily, inorganic (often metals) and they may be chosen not to be photoconductively active. The term "charge transfer layer" is used herein to refer to layers similar to but different from electrodes in that a charge transfer layer only delivers charge carriers from one subsection of an optoelectronic device to the adjacent subsection. The term "charge recombination layer" is used herein to refer to layers similar to but different from electrodes in that a charge recombination layer allows for the recombination of electrons and holes between adjacent charge carrier layers and may also enhance internal optical field strength near one or more active layers. A charge recombination layer can be constructed of semi-transparent metal nanoclusters, nanoparticle or nanorods as described in U.S. Pat. No. 6,657,378, incorporated herein by reference in its entirety.

In another embodiment of the invention, an anode-smoothing layer is situated between the anode and the donor layer. One material for this layer comprises a film of 3,4-polyethylenedioxythiophene:polystyrenesulfonate (PEDOT:PSS). The introduction of the PEDOT:PSS layer between the anode (ITO) and the donor layer (CuPc) may lead to greatly improved fabrication yields. Without being bound by any theory, it is believed that the improved fabrication yields is a result of the ability of the spin-coated PEDOT:PSS film to planarize the ITO, whose rough surface could otherwise result in shorts through the thin molecular layers.

In a further embodiment on the invention, one or more of the layers may be treated with plasma prior to depositing the next layer. The layers may be treated, for example, with a mild argon or oxygen plasma. This treatment is beneficial as it reduces the series resistance. It is particularly advantageous that the PEDOT:PSS layer be subject to a mild plasma treatment prior to deposition of the next layer.

The simple layered structure illustrated in FIG. 1 is provided by way of non-limiting example, and it is understood that embodiments of the invention may be used in connection with a wide variety of other structures. The specific materials and structures described are exemplary in nature, and other materials and structures may be used. Functional organic photosensitive optoelectronic devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Organic layers that are not a part of the photoactive region, i.e., organic layers that generally do not absorb photons that make a significant contribution to photocurrent, may be referred to as "non-photoactive layers." Examples of non-photoactive layers include EBLs and anode-smoothing layers. Other types of non-photoactive layers may also be used.

Non-limiting examples of organic materials for use in the photoactive layers of a photosensitive device include cyclometallated organometallic compounds. The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like.

In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO. The term cyclometallated refers to compounds that comprise an bidentate organometallic ligand so that, upon bonding to a metal, a ring structure is formed that includes the metal as one of the ring members.

Organic layers may be fabricated using vacuum deposition, solution processing, organic vapor-phase deposition, inkjet printing and other methods known in the art. As used herein, solution processing includes spin coating, spray coating, dip coating, doctor's blading, and other techniques known in the art.

Organic photosensitive optoelectronic devices of embodiments of the present invention may function as a device or solar cell, photodetector or photoconductor. Whenever the organic photosensitive optoelectronic devices of the present invention function as a PV device, the materials used in the photoconductive organic layers and the thicknesses thereof may be selected, for example, to optimize the external quantum efficiency of the device. Whenever the organic photosensitive optoelectronic devices of the present invention function as photodetectors or photoconductors, the materials used in the photoconductive organic layers and the thicknesses thereof may be selected, for example, to maximize the sensitivity of the device to desired spectral regions.

This result may be achieved by considering several guidelines that may be used in the selection of layer thicknesses. It is desirable for the exciton diffusion length, $L_D$, to be greater than or comparable to the layer thickness, L, since it is believed that most exciton dissociation will occur at an interface. If $L_D$ is less than L, then many excitons may recombine before dissociation. It is further desirable for the total photoconductive layer thickness to be of the order of the electromagnetic radiation absorption length, $1/\alpha$, where a is the absorption coefficient, so that nearly all of the radiation incident on the PV device is absorbed to produce excitons. Furthermore, the photoconductive layer thickness should be as thin as possible to avoid excess series resistance due to the high bulk resistivity of organic semiconductors.

Accordingly, these competing guidelines inherently require tradeoffs to be made in selecting the thickness of the photoconductive organic layers of a photosensitive optoelectronic cell. Thus, on the one hand, a thickness that is comparable or larger than the absorption length is desirable (for a single cell device) in order to absorb the maximum amount of incident radiation. On the other hand, as the photoconductive layer thickness increases, two undesirable effects are increased. One is that due to the high series resistance of organic semiconductors, an increased organic layer thickness increases device resistance and reduces efficiency. Another undesirable effect is that increasing the photoconductive layer thickness increases the likelihood that excitons will be generated far from the effective field at a charge-separating interface, resulting in enhanced probability of geminate recombination and, again, reduced efficiency. Therefore, a device configuration is desirable which balances between these competing effects in a manner that produces a high external quantum efficiency for the overall device.

The organic photosensitive optoelectronic devices of the present invention may function as photodetectors. In this embodiment, the device may be a multilayer organic device, for example as described in U.S. application Ser. No. 10/723,953, filed Nov. 26, 2003, incorporated herein by reference in its entirety. In this case an external electric field may be generally applied to facilitate extraction of the separated charges.

A concentrator or trapping configuration can be employed to increase the efficiency of the organic photosensitive optoelectronic device, where photons are forced to make multiple passes through the thin absorbing regions. U.S. Pat. Nos. 6,333,458 and 6,440,769, incorporated herein by reference in their entirety, addresses this issue by using structural designs that enhance the photoconversion efficiency of photosensitive optoelectronic devices by optimizing the optical geometry for high absorption and for use with optical concentrators that increase collection efficiency. Such geometries for photosensitive devices substantially increase the optical path through the material by trapping the incident radiation within a reflective cavity or waveguiding structure, and thereby recycling light by multiple reflection through the photoresponsive material. The geometries disclosed in U.S. Pat. Nos. 6,333,458 and 6,440,769 therefore enhance the external quantum efficiency of the devices without causing substantial increase in bulk resistance. Included in the geometry of such devices is a first reflective layer; a transparent insulating layer which should be longer than the optical coherence length of the incident light in all dimensions to prevent optical microcavity interference effects; a transparent first electrode layer adjacent the transparent insulating layer; a photosensitive heterostructure adjacent the transparent electrode; and a second electrode which is also reflective.

In one embodiment, one or more coatings may be used to focus optical energy into desired regions of a device. See, e.g., U.S. Pat. No. 7,196,835; U.S. patent application Ser. No. 10/915,410, the disclosures of which, specifically related to such coatings, are herein incorporated by reference.

Various devices made according to the foregoing disclosures were made and tested. In particular, changes to the thickness of SQ layer, as well as the presence and/or thickness the hole transport layer were measured under 1 sun AM1.5G simulated solar illumination (non-corrected). Results of these tests are provided in Tables 1 and 2, below.

TABLE 1

Structure and photovoltaic data for devices comprising at least one SQ donor or CuPc hole transport layer.

| | CuPc (Å) | SQ (Å) | Voc (V) | Jsc (mA/cm2) | FF | η % |
|---|---|---|---|---|---|---|
| 1 | 50 | 65 | 0.79 | 4.49 | 0.48 | 1.69 |
| 2 | 100 | 65 | 0.70 | 3.83 | 0.49 | 1.31 |
| 3 | 200 | 65 | 0.60 | 3.58 | 0.55 | 1.18 |
| 4 | 0 | 65 | 0.59 | 5.05 | 0.60 | 1.79 |
| 5 | 400 | 0 | 0.42 | 4.06 | 0.58 | 0.99 |
| 1 | 50 | 0 | 0.33 | 3.31 | 0.56 | 0.62 |
| 2 | 50 | 65 | 0.76 | 3.96 | 0.44 | 1.34 |
| 3 | 50 | 130 | 0.79 | 4.12 | 0.40 | 1.28 |
| 4 | 50 | 180 | 0.73 | 4.06 | 0.38 | 1.12 |

TABLE 2

Structure and photovoltaic data for devices comprising at least one SQ donor or NPD hole transport layer.

| | NPD (Å) | SQ (Å) | Voc (V) | Jsc (mA/cm2) | FF | η (%) |
|---|---|---|---|---|---|---|
| 1 | 50 | 65 | 0.78 | 5.13 | 0.63 | 2.5 |
| 2 | 100 | 65 | 0.77 | 5.07 | 0.60 | 2.36 |
| 3 | 150 | 65 | 0.73 | 4.77 | 0.61 | 2.04 |
| 4 | 0 | 65 | 0.67 | 4.9 | 0.63 | 2.06 |

| CuPc (Å) | NPD (Å) | SQ (Å) | Voc (V) | Jsc (mA/cm2) | FF | η (%) |
|---|---|---|---|---|---|---|
| 0 | 50 | 65 | 0.83 | 5.69 | 0.55 | 2.57 |
| 0 | 0 | 65 | 0.80 | 5.17 | 0.53 | 2.19 |

As shown, the Inventors have discovered that squaraine materials are beneficial when used in photovoltaic devices made by organic vapor deposition techniques. The Inventors have also discovered an alternative method of processing squaraine-based PV cells via solution chemistry, such as by spin coating. By taking advantage of the fact that squaraine is a good dye that is soluble in most chlorinated solvents, the Inventors have used solution chemistry in the processing of squaraine-based PV cells that have comparable performance characteristics as devices made by vapor deposition techniques. One benefit of using solution chemistry to process the inventive devices is that it enables the use of more squaraines, since decomposition upon sublimation, as typically employed in vapor deposition techniques, is non-existent.

Other embodiments of the devices and methods described herein will be apparent to those skilled in the art from consideration of the specification and practice. It is intended that the specification and examples be considered as exemplary only, with the true scope of the devices and methods described being indicated by the claims.

Example: Solution Processed Squaraine/C60 Bilayer Photovoltaic Cells

The molecule 2,4-Bis[4-(N,N-diisobutylamino)-2,6-dihydroxyphenyl]squaraine (SQ) was utilized in this example. The device structure comprised: ITO/spin cast SQ (80 Å)/$C_{60}$ (400 Å)/BCP (100 Å)/Al (1000 Å). The thickness of spin cast SQ film was controlled by the concentration of SQ solution, which was in a dichloromethane (DCM) solvent. By dissolving 3 mg of SQ in 2 ml DCM solvent, a SQ solution with 1.5 mg/ml concentration was obtained. The 80A spin cast SQ thin film was prepared by spin coating SQ solution on a pre-cleaned ITO with spin rate of 3000 rpm for 40 s in air. Next $C_{60}$, BCP and AL cathode were deposited on spin cast film under high vacuum.

The SQ device made according to this example was tested by illuminating it under 1 sun AM 1.5G simulated solar illumination. The results of this test are reported in Table 3.

TABLE 3

Structure and photovoltaic data for solution processed SQ devices illuminated under 1 sun AM1.5G simulated solar illumination

| Cell | D/$C_{60}$ (Å) | $M^c$ | $J_{sc}$ (mA cm$^{-2}$) | $V_{oc}$ (V) | FF | η (%) |
|---|---|---|---|---|---|---|
| Spin cast SQ | 80/400 | Al | 5.04 | 0.69 | 0.62 | 2.17 |

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An organic photosensitive optoelectronic device comprising:
   an anode;
   a cathode; and
   at least one Donor-Acceptor heterojunction between the cathode and the anode, the heterojunction comprising at least two donor materials and at least one acceptor material, wherein at least one of the donor materials is a squaraine compound or a combination of squaraine compounds of formula I and forms a layer no more than 100 Å thick:

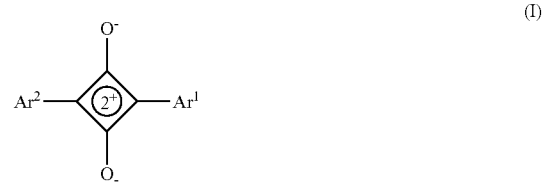

wherein each of Ar¹ and Ar² is independently chosen from an optionally substituted aromatic group.

2. The organic photosensitive optoelectronic device of claim 1, wherein each of Ar¹ and Ar² is independently chosen from a group of formula II:

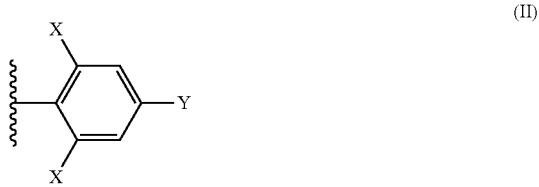

(II)

wherein each X is independently chosen from H, alkyl, alkoxy, halide, and hydroxy; and
Y is chosen from H or an optionally substituted amino group.

3. The organic photosensitive optoelectronic device of claim 2, wherein at least one X group of formula II is hydroxy.

4. The organic photosensitive optoelectronic device of claim 2, wherein each Y group is independently chosen from a group represented by the formula NR¹R², wherein each of R¹ and R² is independently chosen from H or an optionally substituted alkyl or aryl group.

5. The organic photosensitive optoelectronic device of claim 4, wherein at least one of R¹ and R² is a substituted alkyl group.

6. The organic photosensitive optoelectronic device of claim 1, wherein the squaraine compound is represented by formula III:

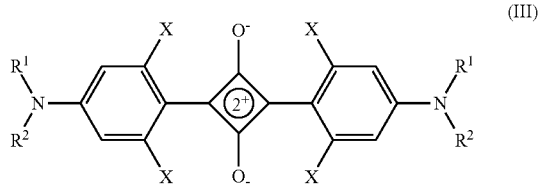

(III)

wherein each X is independently chosen from H, alkyl, alkoxy, halide, and hydroxy; and
each of R¹ and R² is independently chosen from an optionally substituted alkyl or aryl group.

7. The organic photosensitive optoelectronic device of claim 6, wherein at least one X group of the compound of formula III is hydroxy.

8. The organic photosensitive optoelectronic device of claim 1, wherein each of Ar¹ and Ar² is independently chosen from a group represented by the following formula V:

(V)

wherein each of rings A and B are optionally substituted $C_4$-$C_8$ rings, which are fused to form a bicycle saturated on unsaturated ring system comprising 6-14 carbon atoms.

9. The organic photosensitive optoelectronic device of claim 8, wherein the squaraine compound of formula I is chosen from 2,4-Di-3-guaiazulenyl-1,3-dihydroxycyclobutenediylium dihydroxide and a salt thereof.

10. The organic photosensitive optoelectronic device of claim 1, wherein the squaraine compound of formula I is chosen from 2,4-Bis [4-(N,N-dipropylamino)-2,6-dihydroxyphenyl; 2,4-Bis[4-(N,N-diisobutylamino)-2,6-dihydroxyphenyl; and salts thereof.

11. The organic photosensitive optoelectronic device of claim 1, wherein each of Ar¹ and Ar² is independently chosen from a group represented by formula VI:

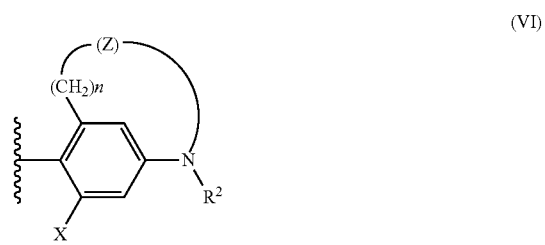

(VI)

wherein n is chosen from 0, 1, 2, 3, 4, 5, and 6; and Z represents a linking group.

12. The organic photosensitive optoelectronic device of claim 1, wherein the squaraine compound of formula I is not symmetric.

13. The organic photosensitive optoelectronic device of claim 1, wherein the squaraine compound of formula I is amorphous.

14. A method of forming an organic photosensitive optoelectronic device, said method comprising:
   forming at least one Donor-Acceptor heterojunction over a first electrode, the heterojunction comprising at least two donor materials and at least one acceptor material, wherein at least one of the donor materials is formed by depositing a squaraine compound or a combination of squaraine compounds of formula I to a thickness of no more than 100 Å:

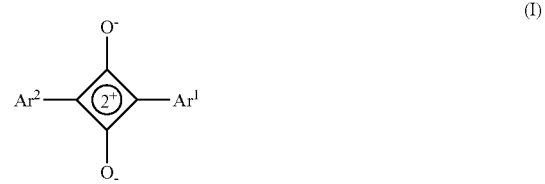

(I)

wherein each of Ar¹ and Ar² is independently chosen from an optionally substituted aromatic group; and
   forming a second electrode over the at least one Donor-Acceptor heterojunction.

15. The method of claim 14, wherein said squaraine compound or combination of squaraine compounds is deposited by one or more processes chosen from vacuum deposition and solution processing.

16. The method of claim 14, wherein the deposited squaraine compound or combination of squaraine compounds forms a discontinuous layer.

17. The method of claim 14, wherein the step of forming at least one Donor-Acceptor heterojunction over a first electrode comprises depositing two or more different squaraine compounds of formula I.

18. An organic photosensitive optoelectronic device comprising:
   an anode;
   a cathode; and
   at least one Donor-Acceptor heterojunction between the cathode and the anode, the heterojunction comprising a donor material and an acceptor material, wherein the donor material is a mixture of at least two different squaraines of formula I and forms a layer no more than 100 Å thick:

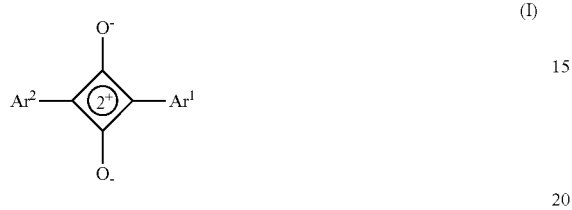

wherein each of $Ar^1$ and Are is independently chosen from an optionally substituted aromatic group.

19. The organic photosensitive optoelectronic device of claim 18, wherein the mixture of at least two different squaraines comprises at least one squaraine chosen from 2,4-Bis [4-(N,N-dipropylamino)-2,6-dihydroxyphenyl; 2,4-Di-3-guaiazulenyl-1,3-dihydroxycyclobutenediylium dihydroxide; 2,4-Bis[4-(N,N-diisobutylamino)-2,6-dihydroxyphenyl; and salts thereof.

* * * * *

UNITED STATES PATENT AND TRADEMARK OFFICE
CERTIFICATE OF CORRECTION

PATENT NO. : 10,374,164 B2
APPLICATION NO. : 14/845895
DATED : August 6, 2019
INVENTOR(S) : Thompson et al.

Page 1 of 1

It is certified that error appears in the above-identified patent and that said Letters Patent is hereby corrected as shown below:

In the Claims

Claim 14, Column 22, Line 53, "Are" should read as --$Ar^2$--.

Signed and Sealed this
Eighth Day of October, 2019

Andrei Iancu
*Director of the United States Patent and Trademark Office*